(12) United States Patent
Taghvaei et al.

(10) Patent No.: US 12,277,991 B2
(45) Date of Patent: Apr. 15, 2025

(54) MEMORY DEVICE WITH RESET VOLTAGE CONTROL

(71) Applicant: Taiwan Semiconductor Manufacturing Company, Ltd., Hsinchu (TW)

(72) Inventors: Ali Taghvaei, Kanata (CA); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 231 days.

(21) Appl. No.: 17/824,738

(22) Filed: May 25, 2022

(65) Prior Publication Data

US 2023/0260558 A1 Aug. 17, 2023

Related U.S. Application Data

(60) Provisional application No. 63/310,528, filed on Feb. 15, 2022.

(51) Int. Cl.
G11C 7/10 (2006.01)
G11C 7/12 (2006.01)
G11C 7/20 (2006.01)

(52) U.S. Cl.
CPC .......... G11C 7/1048 (2013.01); G11C 7/1066 (2013.01); G11C 7/1093 (2013.01); G11C 7/12 (2013.01); G11C 7/20 (2013.01)

(58) Field of Classification Search
CPC ... G11C 7/1048; G11C 7/1066; G11C 7/1093; G11C 7/12; G11C 7/20; G11C 5/025; G11C 11/419; G11C 2207/12; G11C 7/08; G11C 5/147; G11C 5/148; G11C 11/4072;

(Continued)

(56) References Cited

U.S. PATENT DOCUMENTS 7,319,607 B2 1/2008 Sakuma
9,324,384 B2 4/2016 Song et al.
9,653,177 B1 5/2017 Chen et al.
(Continued)

FOREIGN PATENT DOCUMENTS

TW 202147320 A 12/2021

OTHER PUBLICATIONS

Notice of Allowance issued in connection with Taiwan Appl. No. 111147348 dated Jan. 11, 2024.

Primary Examiner — Uyen Smet
(74) Attorney, Agent, or Firm — FOLEY & LARDNER LLP

(57) ABSTRACT

Disclosed herein are related to a memory device. In one aspect, the memory device includes a memory cell, a precharge circuit, a reset voltage control circuit, and a logic control circuit. In one aspect, the precharge circuit is configured to set a voltage of the bit line to a first voltage level. In one aspect, the reset voltage control circuit includes a transistor coupled to the bit line to set the voltage of the bit line to a second voltage level. The transistor can be arranged or operate as a diode. In one aspect, the logic control circuit is configured to cause the reset voltage control circuit to set the voltage of the bit line to the second voltage level during a reset phase and cause the precharge circuit to set the voltage of the bit line to the first voltage level during a precharge phase after the reset phase.

20 Claims, 8 Drawing Sheets

(58) Field of Classification Search
CPC ............ G11C 11/4074; G11C 11/4085; G11C 11/4094
See application file for complete search history.

(56) References Cited

U.S. PATENT DOCUMENTS

2008/0239848 A1\* 10/2008 Hur ..................... G11C 11/4096
  365/203
2010/0195415 A1\* 8/2010 Seko ........................ G11C 7/02
  365/207
2014/0254238 A1\* 9/2014 Gilbert ................ G11C 13/004
  365/148

\* cited by examiner

MEMORY DEVICE WITH RESET VOLTAGE CONTROL

CROSS-REFERENCE TO RELATED APPLICATION

This application claims priority to and the benefit of U.S. Provisional Application No. 63/310,528, filed Feb. 15, 2022, entitled "SPEED CONTROL FOR LOW LEAKAGE MEMORY USING BITLINE PRECHARGE DIODES", which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices or non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
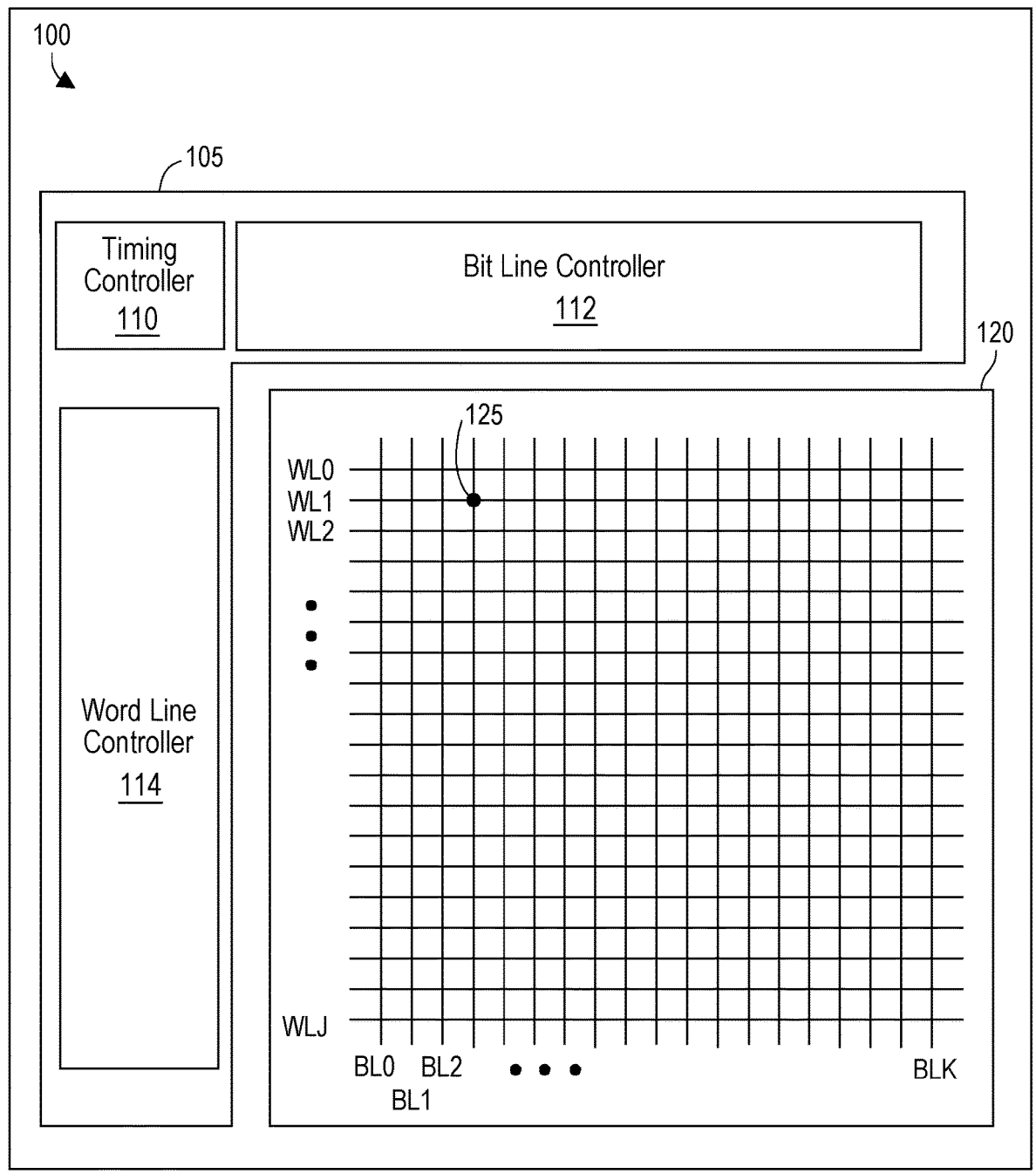
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory device with a reset voltage control. In one aspect, the memory device includes a memory cell, a precharge circuit, a reset voltage control circuit, and a logic control circuit. In one aspect, the precharge circuit is configured to set a voltage of the bit line to a first voltage level. In one aspect, the reset voltage control circuit includes a transistor coupled to the bit line to set the voltage of the bit line to a second voltage level. The second voltage level may be less than the first voltage level. For example, the first voltage level may be a supply voltage level VDD or 1V, and the second voltage level may be a difference between the supply voltage level VDD and a threshold voltage Vth of a transistor or a diode. (e.g., VDD−Vth). The transistor can be arranged or operate as a diode. In one aspect, the logic control circuit is configured to cause the reset voltage control circuit to set the voltage of the bit line to the second voltage level during a reset phase and cause the precharge circuit to set the voltage of the bit line to the first voltage level during a precharge phase after the reset phase. After the precharge phase, the logic control circuit may cause the bit line to be discharged during a sensing phase, according to data stored by the memory cell. Discharging a bit line herein refers to removing electrical charges at the bit line to lower or reduce a voltage of the bit line. The logic control circuit may determine the data stored by the memory cell during the sensing phase, according to the voltage of the bit line discharged during the sensing phase.

Advantageously, the memory device can operate faster by setting the voltage of the bit line to the second voltage level (e.g., VDD-Vth (threshold voltage) of the transistor). In one implementation, during the reset phase, the bit line can be discharged or set to, for example, a ground voltage level (e.g., 0V or GND). During the precharge phase after the reset phase, the voltage of the bit line can be set to the first voltage level (e.g., VDD or 1V). Then, during the sensing phase, the voltage of the bit line can be discharged, according to data stored by a memory cell, and the data stored by the memory cell can be determined according to the voltage of the bit line discharged. However, charging the bit line or setting the voltage of the bit line to the first voltage level from the ground voltage level (e.g., 0V or GND) may take a long time, and may limit or lower the speed of the memory device. By setting the voltage of the bit line to be at the second voltage level between the first voltage level (e.g., VDD or 1V) and the ground voltage level during the reset phase, charging the bit line or setting the voltage of the bit line to the first voltage level can be performed faster. Accordingly, by setting the voltage of the bit line to the second voltage level during the reset phase, an operating speed of the memory device can be improved, because time to charge the voltage of the bit line to the first voltage level during the precharge phase can be reduced.

In one aspect, the memory device can be adaptively configured or operated in a selected mode by enabling or disabling the reset voltage control circuit. For example, in a first operating mode (or a normal operating mode), the reset voltage control circuit can be disabled during the reset phase, such that the voltage of the bit line can be discharged to the ground voltage level. By setting the voltage of the bit line to the ground voltage level during the reset phase, leakage current during the reset phase can be reduced. For example, in a second operating mode (or a turbo operating mode), the reset voltage control circuit can be enabled during the reset phase, such that the voltage of the bit line can be set to the second voltage level (e.g., VDD-Vth (threshold voltage) of the transistor). By setting the voltage of the bit line to the second voltage level (e.g., VDD-Vth) during the reset phase, time to charge the voltage of the bit line to the first voltage level during the precharge phase can be reduced, such that the memory device in the second operating mode can perform a read operation faster than in the first operating mode.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data to a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
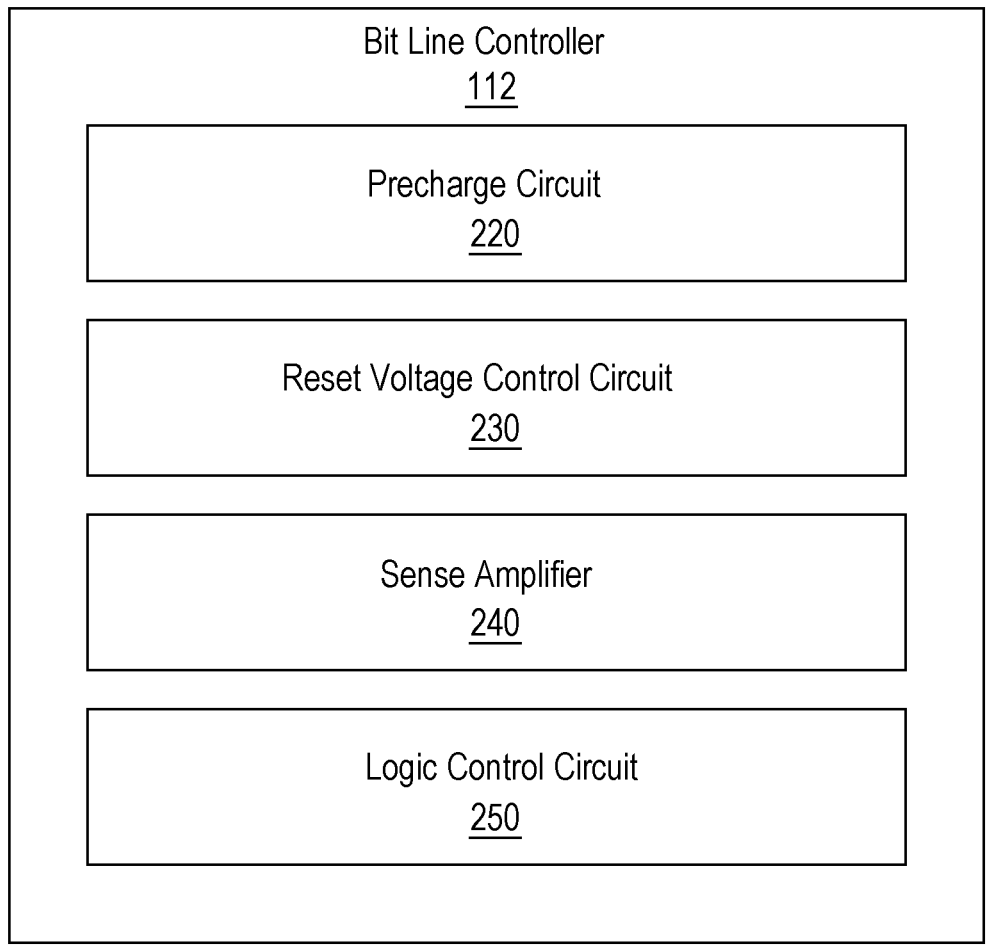
FIG. 2 illustrates a schematic block diagram of an example bit line controller, in accordance with some embodiments.

FIG. 2 illustrates a schematic block diagram of an example bit line controller 112, in accordance with some embodiments. In some embodiments, the bit line controller 112 includes a precharge circuit 220, a reset voltage control circuit 230, a sense amplifier 240, and a logic control circuit 250. These components may operate together to determine data stored by a memory cell 125. For example, the reset voltage control circuit 230 may set a voltage of a bit line BL to a reset voltage level during a reset phase, and the precharge circuit 220 may set the voltage of the bit line BL to a precharge voltage level or a supply voltage level during a precharge phase. During a sensing phase, the bit line BL may be discharged according to data stored by the memory cell. The sense amplifier 240 may sense the voltage or current of the bit line during the sensing phase to determine the data stored by the memory cell 125. In some embodiments, the bit line controller 112 includes more, fewer, or different components than shown in FIG. 2.

In some embodiments, the precharge circuit 220 is a circuit that sets or precharges a voltage of a bit line BL to a supply voltage level (e.g., VDD or 1V). In some embodiments, the precharge circuit 220 can be replaced by a different circuit or a different component that can perform the functions of the precharge circuit 220 described herein. In one configuration, the precharge circuit 220 includes a transistor or a switch that can selectively couple a power rail or a metal rail having a supply voltage level (e.g., VDD or 1V) to a bit line BL, according to a control signal. For example, in response to a control signal having a supply voltage level (e.g., 1V), the precharge circuit 220 can be disabled to electrically decouple the bit line BL from the power rail or the metal rail, such that the voltage of the bit line BL may not be set to the supply voltage level. For example, in response to the control signal having a ground voltage level (e.g., 0V), the precharge circuit 220 can be enabled to electrically couple the bit line BL to the power rail or the metal rail, such that the voltage of the bit line BL may be set to the supply voltage level (e.g., VDD or 1V).

In some embodiments, the reset voltage control circuit 230 is a circuit that sets or precharges a voltage of a bit line BL to a reset voltage level. The reset voltage level may be lower than the supply voltage level (e.g., VDD or 1V), and higher than the ground voltage level (e.g., GND or 0V). In some embodiments, the reset voltage control circuit 230 can be replaced by a different circuit or a different component that can perform the functions of the reset voltage control circuit 230 described herein. In one configuration, the reset voltage control circuit 230 includes a transistor in a diode connected configuration or a diode coupled to the bit line BL. A transistor in a diode connected configuration herein refers to a drain electrode of the transistor and a gate electrode of the transistor coupled to each other or having a same voltage. The reset voltage control circuit 230 may selectively set a voltage of the bit line BL to the reset voltage level, according to a control signal. When the diode or the transistor in the diode connected configuration is enabled, a voltage of the bit line BL may be reduced from the supply voltage level by a threshold voltage of the diode or the transistor. For example, in response to a control signal having a ground voltage level (e.g., GND or 0V), the reset voltage control circuit 230 can be disabled to electrically decouple the bit line BL from the power rail or the metal rail providing a supply voltage, such that the voltage of the bit line BL may not be set to the reset voltage level. For example, in response to the control signal having a supply voltage level (e.g., VDD or 1V), the reset voltage control circuit 230 can be enabled to electrically couple the bit line BL to the power rail or the metal rail through the diode or the transistor in the diode connected configuration, such that the voltage of the bit line BL may be set to the reset voltage level (e.g., VDD−Vth of the transistor).

In some embodiments, the sense amplifier 240 is a component that amplifies a voltage of the bit line BL. In some embodiments, the sense amplifier 240 can be replaced by a different circuit or a different component that can perform the functions of the sense amplifier 240 described herein. In one configuration, the sense amplifier 240 can be implemented as a comparator that compares a voltage of the bit line BL against a reference voltage or a voltage of a counterpart bit line BLB and generates a signal or a voltage in a digital representation corresponding to the comparison. For example, if the sensed voltage of the bit line BL is lower than the reference voltage or the voltage of the bit line BLB, then the sense amplifier 240 may generate an output voltage corresponding to a logic state '0'. For example, if the sensed voltage of the bit line BL is higher than the reference voltage or the voltage of the bit line BLB, then the sense amplifier 240 may generate an output voltage corresponding to a logic state '1'.

In some embodiments, the logic control circuit 250 is a component that generates one or more control signals to control operations of the precharge circuit 220, the reset voltage control circuit 230, and the sense amplifier 240. In some embodiments, the logic control circuit 250 can be replaced by a different circuit or a different component that can perform the functions of the logic control circuit 250 described herein. In some embodiments, the logic control circuit 250 is implemented as a field gate programmable array (FPGA), digital logic circuit, application specific integrated circuit (ASIC), etc. In some embodiments, the logic control circuit 250 is implemented as or replaced by a processor and a non-transitory computer readable medium storing instructions when executed by the processor cause the processor to perform various functions of the logic control circuit 250 described herein. In one aspect, the logic control circuit 250 generates control signals, and provides the control signals to the precharge circuit 220, the reset voltage control circuit 230, and the sense amplifier 240 to coordinate operations of the precharge circuit 220, the reset voltage control circuit 230, and the sense amplifier 240. In one example, to read data stored by a memory cell 125, the logic control circuit 250 may configure or operate the precharge circuit 220, the reset voltage control circuit 230, and the sense amplifier 240 through three phases: a reset phase, a precharge phase, and a sensing phase.

In the reset phase, the logic control circuit 250 may generate and provide control signals to the precharge circuit 220 and the reset voltage control circuit 230 to set a voltage of a bit line BL coupled to the memory cell 125 to the reset voltage level. For example, the logic control circuit 250 may generate control signals to enable the reset voltage control circuit 230 and disable the precharge circuit 220 during the reset phase. The logic control circuit 250 may generate a control signal to disable the sense amplifier 240 during the reset phase.

In the precharge phase, the logic control circuit 250 may generate and provide control signals to the precharge circuit 220 and the reset voltage control circuit 230 to set the voltage of the bit line BL coupled to the memory cell 125 to the supply voltage level. For example, the logic control circuit 250 may generate control signals to disable the reset voltage control circuit 230 and enable the precharge circuit 220 during the precharge phase. The logic control circuit 250 may generate a control signal to disable the sense amplifier 240 during the precharge phase.

In the sensing phase, the bit line BL can be discharged, according to data stored by the memory cell 125. In one approach, during the sensing phase, the word line control circuit 114 can generate a control signal to couple the memory cell 125 to the bit line BL, such that the voltage of the bit line BL can be changed or adjusted, according to the data stored by the memory cell 125. For example, if the memory cell 125 stores a bit '0' corresponding to the ground voltage level (e.g., 0V), then the voltage of the bit line BL may become or decreased towards the ground voltage level (e.g., 0V). For example, if the memory cell 125 stores a bit '1' corresponding to the supply voltage level (e.g., 1V), then the voltage of the bit line BL may remain at the supply voltage level. During the sensing phase, the logic control circuit 250 may generate and provide control signals to cause the sense amplifier 240 to sense the voltage of the bit line BL. For example, the logic control circuit 250 may generate control signals to disable the reset voltage control circuit 230 and the precharge circuit 220, during the sensing phase. The logic control circuit 250 may generate a control signal to enable the sense amplifier 240 during the sensing phase, such that the sense amplifier 240 can amplify the voltage of the bit line BL, or amplify a difference between the voltage of the bit line BL and the voltage of the bit line BLB to provide the amplified voltage as the output voltage. During the sensing phase, the logic control circuit 250 may determine the data stored by the memory cell 125, according to an output voltage of the sense amplifier 240.

Advantageously, the memory device 100 can operate faster by setting the voltage of the bit line BL to the reset voltage level (e.g., VDD-Vth). By setting the voltage of the bit line BL to be at the reset voltage level rather than the ground voltage level (e.g., GND or 0V) during the reset phase, charging the bit line BL or setting the voltage of the bit line BL to the supply voltage level (e.g., VDD or 1V) can be performed faster. Accordingly, by setting the voltage of the bit line BL to the reset voltage level during the reset phase, an operating speed of the memory device 100 can be improved, because time to charge the voltage of the bit line BL to the supply voltage level during the precharge phase can be reduced.

In one aspect, the logic control circuit 250 can selectively enable or disable the reset voltage control circuit 230 during the reset phase, according to an operating mode of the memory device 100. The logic control circuit 250 may receive a mode signal indicating an operating mode of the memory device 100 from the timing controller 110, a control device, or an external component, and determine the operating mode of the memory device 100 as indicated by the mode signal. For example, in a first operating mode (or a normal operating mode), the logic control circuit 250 can disable the reset voltage control circuit 230 during the reset phase, such that the voltage of the bit line BL can be discharged to the ground voltage level (e.g., GND or 0V). By setting the voltage of the bit line BL to the ground voltage level during the reset phase, leakage current during the reset phase can be reduced. For example, in a second operating mode (or a turbo operating mode), the logic control circuit 250 can enable the reset voltage control circuit 230 during the reset phase, such that the voltage of the bit line BL can be set to the reset voltage level (e.g., VDD-Vth). By setting the voltage of the bit line BL to the reset voltage level (e.g., VDD-Vth) during the reset phase, time to charge the voltage of the bit line BL to the supply voltage level during the precharge phase can be reduced, such that the memory device 100 in the second operating mode (or a turbo operating mode) can perform a read operation faster than in the first operating mode (or a normal operating mode).

Figure 3:
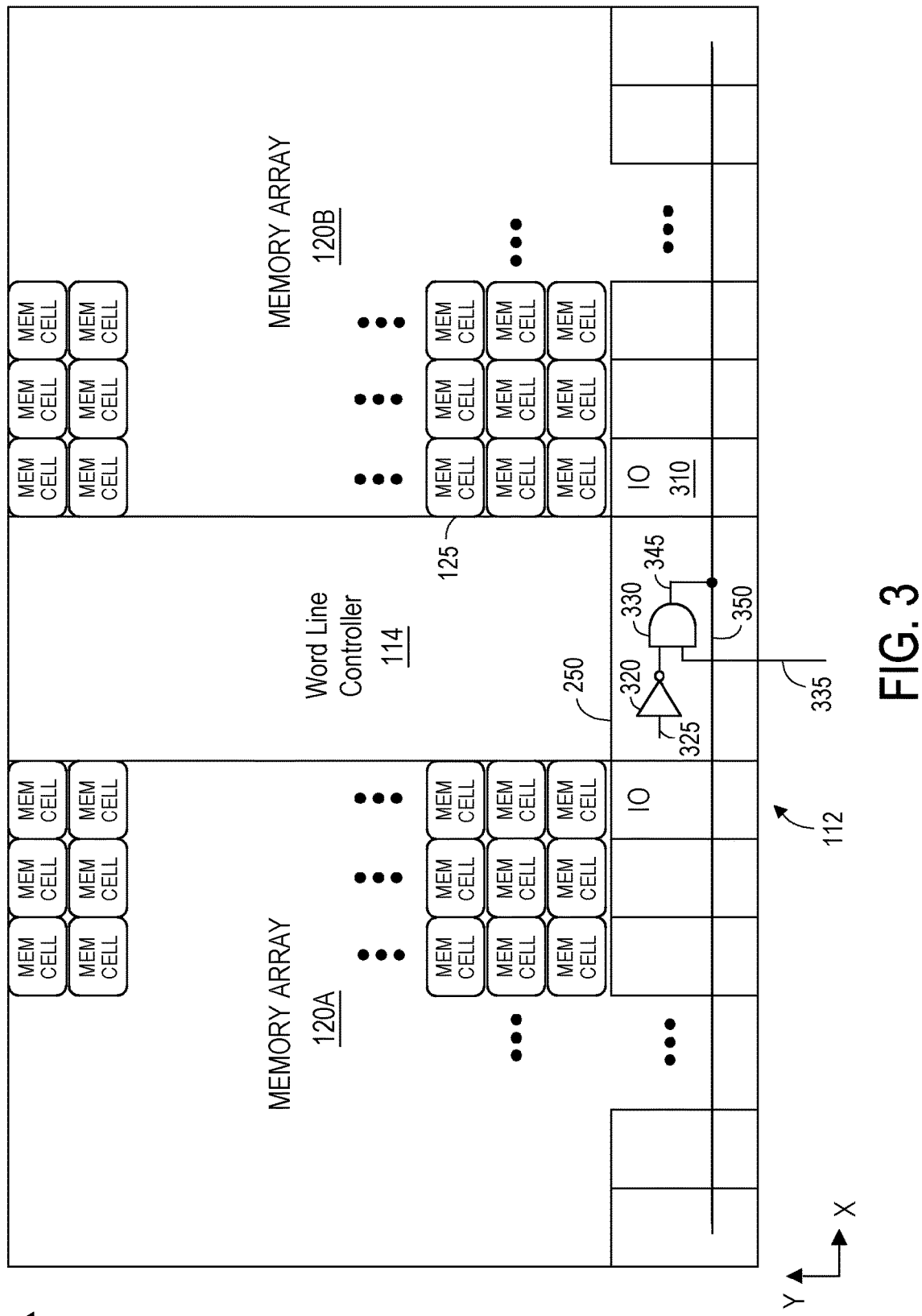
FIG. 3 illustrates a floor plan of a memory device, in accordance with some embodiments.

FIG. 3 illustrates a floor plan of a memory device 100 or a portion of the memory device 100, in accordance with some embodiments. In one configuration, the memory device 100 includes memory arrays 120A, 120B, and a word line controller 114 disposed between the memory arrays 120A. In one configuration, the memory device 100 includes a bit line controller 112 disposed below the memory arrays 120A, 120B and the word line controller 114. In this configuration, memory cells 125 in the memory arrays 120A, 120B can be coupled to the word line controller 114 through word lines WL extending along the X-direction. In addition, memory cells 125 in the memory arrays 120A, 120B can be coupled to the bit line controller 112 through bit lines BL extending along the Y-direction. Hence, the word line controller 114 can provide control signals (e.g., word line control signals) through one or more word lines WL, while the bit line controller 112 can provide or receive signals through one or more bit lines BL to control operations of the memory arrays 120A, 120B.

In one configuration, the bit line controller 112 includes IO circuits 310 disposed along the X-direction, and the logic control circuit 250 disposed below the word line controller 114. Each IO circuit 310 may include a precharge circuit 220, a reset voltage control circuit 230, and a sense amplifier 240. In one configuration, the bit line controller 112 includes a control line 350 extending along the X-direction. The control line 350 may be a metal rail or a conductive rail that can electrically couple the logic control circuit 250 to IO circuits 310 disposed along the X-direction. For example, the logic control circuit 250 includes an inverter 320 and an AND logic gate 330. The inverter 320 may receive a word line control signal 325, based on which the word line controller 114 can drive or control the memory cells 125. The AND gate 330 may include a first input coupled to an output of the inverter 320, and a second input to receive a mode select signal 335, for example, from the timing controller 110, a processor, or an external component. An output of the AND gate 330 may be coupled to reset voltage control circuits 230 of the IO circuits 310 through the control line 350. In this configuration, the logic control circuit 250 can control IO circuits 310 disposed along the X-direction by providing a reset control signal 345 through the control line 350, according to the word line control signal 325 and the mode select signal 335. For example, when the mode select signal 335 has a ground voltage level (e.g., GND or 0V) corresponding to a first operating mode (or a normal operating mode), then the logic control circuit 250 may provide the reset control signal 345 having a ground voltage level (e.g., GND or 0V) to the reset voltage control circuits 230 of the IO circuit 310 through the control line 350. For example, when the mode select signal 335 has a supply voltage level (e.g., VDD or 1V) corresponding to a second operating mode (or a turbo operating mode), then the logic control circuit 250 may provide the reset control signal 345 having an opposite phase of the word line control signal 325 to the reset voltage control circuits 230 of the IO circuit 310 through the control line 350. Hence, the logic control circuit 250 can selectively configure or operate the IO circuits 310 in a selected operating mode by providing the reset control signal 345 through the control line 350.

Figure 4A:
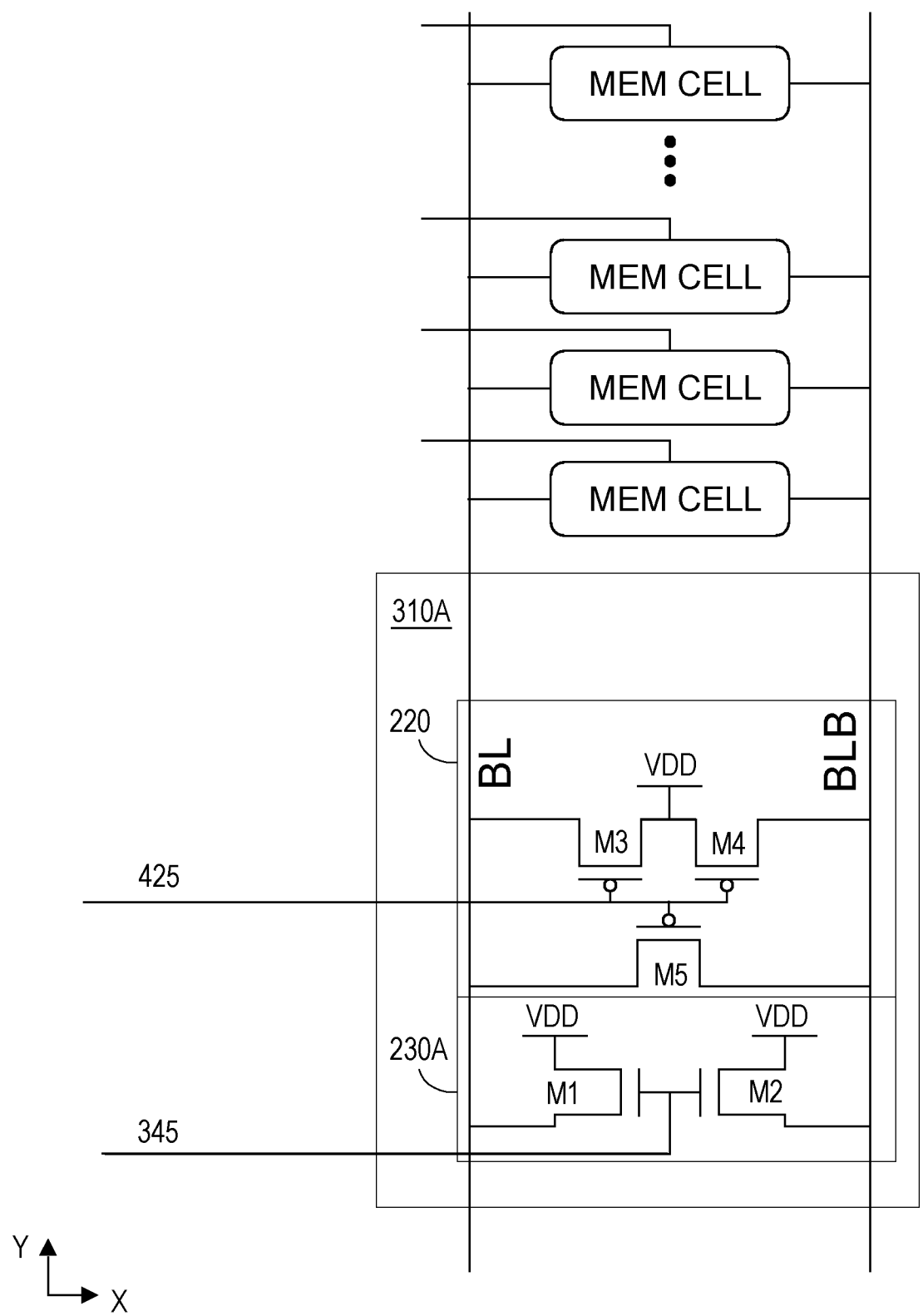
FIG. 4A illustrates a schematic diagram of a set of memory cells, a precharge circuit, and a reset voltage control circuit, in accordance with some embodiments.

FIG. 4A illustrates a schematic diagram of a set of memory cells 125 disposed along the Y-direction, and an IO circuit 310A coupled to the set of memory cells 125. In one configuration, the IO circuit 310A includes a precharge circuit 220 and a reset voltage control circuit 230A coupled to the memory cells 125 through bit lines BL, BLB. The bit lines BL, BLB may provide differential signals. In this configuration, the precharge circuit 220 and the reset voltage control circuit 230 may set voltages of the bit lines BL, BLB. For example, the precharge circuit 220 may set the voltages of the bit lines BL, BLB to a supply voltage level (e.g., VDD or 1V) during a precharge phase, according to the precharge control signal 425. For example, the reset voltage control circuit 230A may set the voltages of the bit lines BL, BLB, to a reset voltage level (e.g., VDD-Vth), during a reset phase, according to the reset control signal 345.

In some embodiments, the precharge circuit 220 includes transistors M3, M4, M5. The transistors M3, M4, M5 may be P-type transistors (e.g., P-type MOSFETs, P-type FinFETs, etc.). In one configuration, the transistor M3 includes a source electrode coupled to a power rail to receive the supply voltage having a supply voltage level VDD, a gate electrode to receive the precharge control signal 425, and a drain electrode coupled to the bit line BL. In one configuration, the transistor M4 includes a source electrode coupled to the power rail to receive the supply voltage having the supply voltage level VDD, a gate electrode coupled to the gate electrode of the transistor M3 to receive the precharge control signal 425, and a drain electrode coupled to the bit line BLB. In one configuration, the transistor M5 includes a source electrode coupled to the bit line BL, a gate electrode coupled to the gate electrode of the transistor M3 and the gate electrode of the transistor M4 to receive the precharge control signal 425, and a drain electrode coupled to the bit line BLB. In this configuration, the transistors M3, M4, M5 can be enabled or disabled in response to the precharge control signal 425 from the logic control circuit 250. For example, in response to the precharge control signal 425 having a ground voltage level (e.g., GND or 0V), the transistors M3, M4, M5 can be enabled to set the voltage of the bit lines BL, BLB to have the supply voltage level VDD. For example, in response to the precharge control signal 425 having a supply voltage level (e.g., VDD or 1V), the transistors M3, M4, M5 can be disabled to not set the voltage of the bit lines BL, BLB to have the supply voltage level VDD.

In some embodiments, the reset voltage control circuit 230A includes transistors M1, M2. The transistors M1, M2 may be N-type transistors (e.g., N-type MOSFETs, N-type FinFETs, etc.). In one configuration, the transistor M1 includes a drain electrode coupled to a power rail to receive the supply voltage having a supply voltage level VDD, a gate electrode to receive the reset control signal 345, and a source electrode coupled to the bit line BL. In one configuration, the transistor M2 includes a drain electrode coupled to the power rail to receive the supply voltage having the supply voltage level VDD, a gate electrode coupled to the gate electrode of the transistor M1, and a source electrode coupled to the bit line BLB. In one configuration, drain electrode of the transistors M1, M2 may be coupled to the same power rail, to which source electrodes of the transistors M3, M4 of the precharge circuit 220 are coupled. In one configuration, drain electrodes of the transistors M1, M2 may be coupled to a different power rail than a power rail, to which source electrodes of the transistors M3, M4 of the precharge circuit 220 are coupled. In one aspect, the transistors M1, M2 can selectively operate as diodes, according to the reset control signal 345. For example, in response to the reset control signal 345 having a supply voltage level (e.g., VDD or 1V), the transistors M1, M2 can be arranged in a diode connected configuration to set the voltage of the bit lines BL, BLB to have the reset voltage level VDD-Vth (e.g., threshold voltage of the transistors M1, M2). For example, in response to the reset control signal 345 having a ground voltage level (e.g., GND or 0V), the transistors M1, M2 can be disabled to not set the voltage of the bit lines BL, BLB to have the reset voltage level.

Figure 4B:
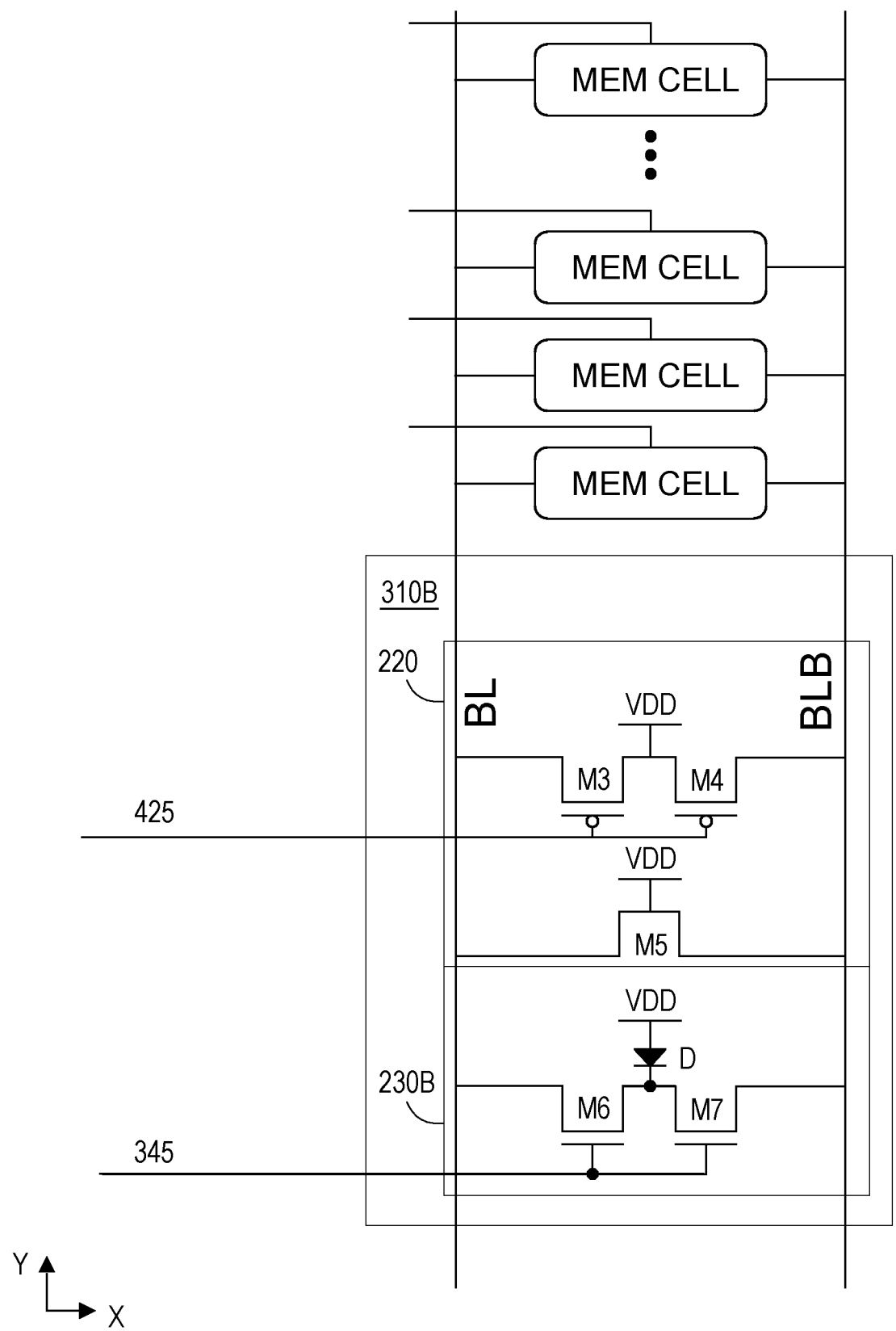
FIG. 4B illustrates a schematic diagram of a set of memory cells, a precharge circuit, and a reset voltage control circuit, in accordance with some embodiments.

FIG. 4B illustrates a schematic diagram of a set of memory cells 125 disposed along the Y-direction, and an IO circuit 310B coupled to the set of memory cells 125. In one aspect, the IO circuit 310B is similar to the IO circuit 310A in FIG. 4A, except the IO circuit 310B includes the reset voltage control circuit 230B instead of the reset voltage control circuit 230A. Thus, detailed description of duplicated portion thereof is omitted herein for the sake of brevity.

In some embodiments, the reset voltage control circuit 230B includes transistors M6, M7, and a diode D. The transistors M6, M7 may be N-type transistors (e.g., N-type MOSFETs, N-type FinFETs, etc.). In one configuration, the diode D includes a first electrode (e.g., anode) coupled to a power rail to receive the supply voltage having a supply voltage level VDD, and a second electrode (e.g., cathode) coupled to drain electrodes of the transistors M6, M7. In one configuration, the transistor M6 includes a gate electrode to receive the reset control signal 345, and a source electrode coupled to the bit line BL. In one configuration, the transistor M7 includes a gate electrode coupled to the gate electrode of the transistor M6 to receive the reset control signal 345, and a source electrode coupled to the bit line BLB. In this configuration, the transistors M6, M7 can operate as switches to selectively couple the diode D to the bit lines BL, BLB, according to the reset control signal 345. For example, in response to the reset control signal 345 having a supply voltage level (e.g., VDD or 1V), the transistors M6, M7 can be enabled to couple the diode D to the bit lines BL, BLB, such that the voltage of the bit lines BL, BLB can have the reset voltage level VDD-Vth (e.g., threshold voltage of the diode D). For example, in response to the reset control signal 345 having a ground voltage level (e.g., GND or 0V), the transistors M6, M7 can be disabled to decouple the diode D from the bit lines BL, BLB, such that the voltage of the bit lines BL, BLB may not have the reset voltage level.

Figure 5A:
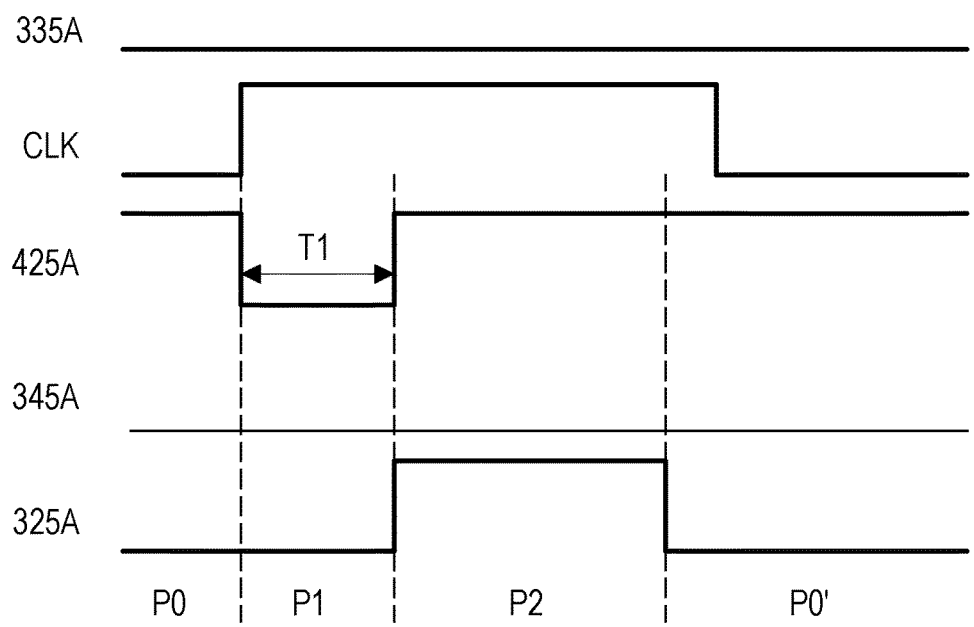
FIG. 5A illustrates a timing diagram of signals for performing a read operation in a first operating mode, in accordance with some embodiments.

FIG. 5A illustrates a timing diagram 500A of signals for performing a read operation in a first operating mode (e.g., normal operating mode), in accordance with some embodiments. Reading data stored by a memory cell 125 may be performed, according to signals CLK, 425A, 345A, 325A. To read data stored by a memory cell 125, the memory device 100 may operate in three phases: a reset phase P0, a precharge phase P1, and a sensing phase P2. In FIG. 5A, the mode selection signal 335A may have a ground voltage level (e.g., GND or 0V) during the phases P0-P2 to indicate a first operating mode. Hence, the bit line controller 112 may generate the reset control signal 345A having a ground voltage level (e.g., GND or 0V) during the phases P0-P2, in response to the mode selection signal 335A having the ground voltage level (e.g., GND or 0V). In response to the reset control signal 345A having the ground voltage level, the reset voltage control circuit 230 may be disabled in the first operating mode (e.g., normal operating mode).

In one approach, in the reset phase P0, the timing controller 110 may generate a clock signal CLK having a ground voltage level (e.g., GND or 0V). In the reset phase P0, the bit line controller 112 may generate the precharge control signal 425A having a supply voltage level (e.g., VDD or 1V). In response to the precharge control signal 425A having the supply voltage level, the precharge circuit 220 may be disabled during the reset phase P0. In the reset phase P0, the word line controller 114 may generate the word line control signal 325A having a ground voltage level (e.g., GND or 0V). In response to the word line control signal 325A having the ground voltage level, the memory cell 125 may be decoupled from the bit lines BL, BLB during the reset phase P0.

In one approach, in the precharge phase P1, the timing controller 110 may generate the clock signal CLK having a supply voltage level (e.g., VDD or 1V). According to the clock signal CLK, the bit line controller 112 may generate a precharge control signal 425A. For example, in response to the rising edge of the clock signal CLK, the bit line controller 112 may generate the precharge control signal 425A having the falling edge. The bit line controller 112 may generate the precharge control signal 425A having a ground voltage level (e.g., GND or 0V) for a time period T1. In response to the precharge control signal 425A having the ground voltage level, the precharge circuit 220 may be enabled to set the voltage of the bit lines BL, BLB to be the supply voltage level (e.g., VDD or 1V) during the precharge phase P1. In the precharge phase P1, the word line controller 114 may generate the word line control signal 325A having a ground voltage level (e.g., GND or 0V). In response to the word line control signal 325A having the ground voltage level, the memory cell 125 may be decoupled from the bit lines BL, BLB during the precharge phase P1.

In one approach, in the sensing phase P2, the timing controller 110 may generate the clock signal CLK having a supply voltage level (e.g., VDD or 1V). During the sensing phase P2 after the time period T1 for the precharge phase P1, the bit line controller 112 may generate the precharge control signal 425A having a supply voltage level (e.g., VDD or 1V). In response to the precharge control signal 425A having the supply voltage level, the precharge circuit 220 may be disabled during the sensing phase P2. According to the precharge control signal 425A, the word line controller 114 may generate the word line control signal 325A. For example, the word line controller 114 may generate a word line control signal 325A having a rising edge, in response to a rising edge of the precharge control signal 425A. In response to the word line control signal 325A having the supply voltage level (e.g., VDD or 1V), the memory cell 125 may be coupled to the bit lines BL, BLB during the sensing phase P2, such that the bit lines BL, BLB can be discharged according to data stored by the memory cell 125 during the sensing phase. For example, in response to the memory cell 125 storing a bit '0', the voltage of the bit line BL may be lower than a reference voltage or the voltage of the bit line BLB. For example, in response to the memory cell 125 storing a bit '1', the voltage of the bit line BL may be higher than the reference voltage or the voltage of the bit line BLB. Hence, by sensing a voltage or voltages of bit lines BL, BLB during the sensing phase P2, data stored by a memory cell 125 can be determined.

After the sensing phase P2, the memory device 100 may operate in a subsequent reset phase P0'. The memory device 100 in the subsequent reset phase P0' may operate in a similar manner as in the reset phase P0. Thus, detailed description of duplicated portion thereof is omitted herein for the sake of brevity.

Figure 5B:
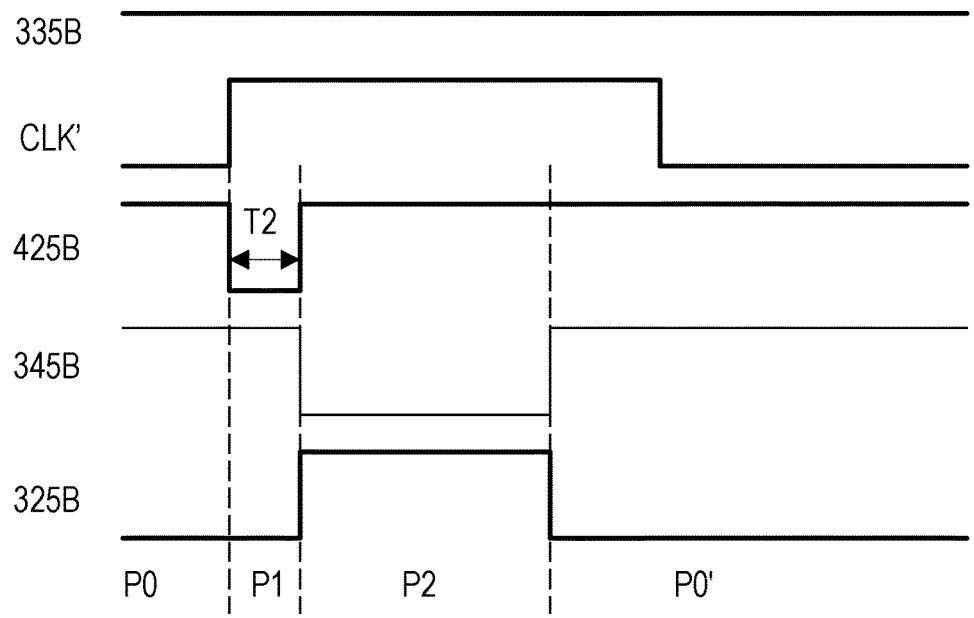
FIG. 5B illustrates a timing diagram of signals for performing a read operation in a second operating mode, in accordance with some embodiments.

FIG. 5B illustrates a timing diagram 500B of signals for performing a read operation in a second operating mode (e.g., turbo operating mode), in accordance with some embodiments. In one aspect, the operation of the memory device 100 in the second operating mode (e.g., turbo operating mode) is similar to the operation in the first operating mode (e.g., normal operating mode), except the mode selection signal 335B may have a supply voltage level (e.g., VDD or 1V) during the phases P0-P2 such that i) the reset control signal 345B may have a pulse and ii) the precharge control signal 425B may have a narrower pulse width than the precharge control signal 425A. Thus, detailed description on duplicated portion thereof is omitted herein for the sake of brevity.

In one approach, in the second operating mode (e.g., turbo operating mode), the reset voltage control circuit 230 may generate the reset control signal 345B having an inverse phase of the word line control signal 325B. For example, in the reset phase P0 and the precharge phase P1, the reset voltage control circuit 230 may generate the reset control signal 345B having the supply voltage level (e.g., VDD or 1V), in response to the word line control signal 325B having the ground voltage level (e.g., GND or 0V). In response to the reset control signal 345B having the supply voltage level (e.g., VDD or 1V), the reset voltage control circuit 230 can be enabled to set voltages of the bit lines BL, BLB to the reset voltage level (e.g., VDD-Vth of a transistor or a diode). For example, in the sensing phase P2, the reset voltage control circuit 230 may generate the reset control signal 345B having the ground voltage level (e.g., GND or 0V), in response to the word line control signal 325B having the supply voltage level (e.g., VDD or 1V). In response to the reset control signal 345B having the ground voltage level (e.g., GND or 0V), the reset voltage control circuit 230B can be disabled to not set voltages of the bit lines BL, BLB to the reset voltage level. Meanwhile, in response to the word line control signal 325B having the supply voltage level (e.g., VDD or 1V) in the sensing phase, the memory cell 125 may be coupled to the bit lines BL, BLB during the sensing phase P2, such that the bit lines BL, BLB can be discharged according to data stored by the memory cell 125.

In some embodiments, the memory device 100 can operate faster by setting the voltage of the bit line BL to the second voltage level (e.g., VDD-Vth (threshold voltage) of the transistor). For example, the memory device 100 operating in the second operating mode (e.g., turbo operating mode) may have a shorter time period T2 for the discharge phase P1, than a time period T1 for the discharge phase P1 in the first operating mode (e.g. normal operating mode). In one aspect, by setting the voltages of bit lines BL, BLB to the reset voltage level in the reset phase P0 in the second operating mode (e.g., turbo operating mode), charging the bit lines BL, BLB or setting the voltages of the bit lines BL, BLB to the supply voltage level (e.g., VDD or 1V) in the precharge phase P1 can be performed faster than charging the bit lines BL, BLB or setting the voltages of the bit lines BL, BLB from the ground voltage level (e.g., GND or 0V) to the supply voltage level (e.g., VDD or 1V) in the first operating mode (e.g., normal operating mode). Accordingly, the memory device 100 operating in the second operating mode (e.g., turbo operating mode) may have a shorter time period T2 for the discharge phase P1 than the time period T1 for the discharge phase P1 in the first operating mode (e.g. normal operating mode). By reducing the time period T2 for the discharge phase P1, the clock signal CLK' in the second operating mode (e.g., turbo operating mode) may have a higher frequency than the clock signal CLK in the first operating mode (e.g., normal operating mode), thereby allowing a faster operating speed of the memory device 100.

Figure 6:
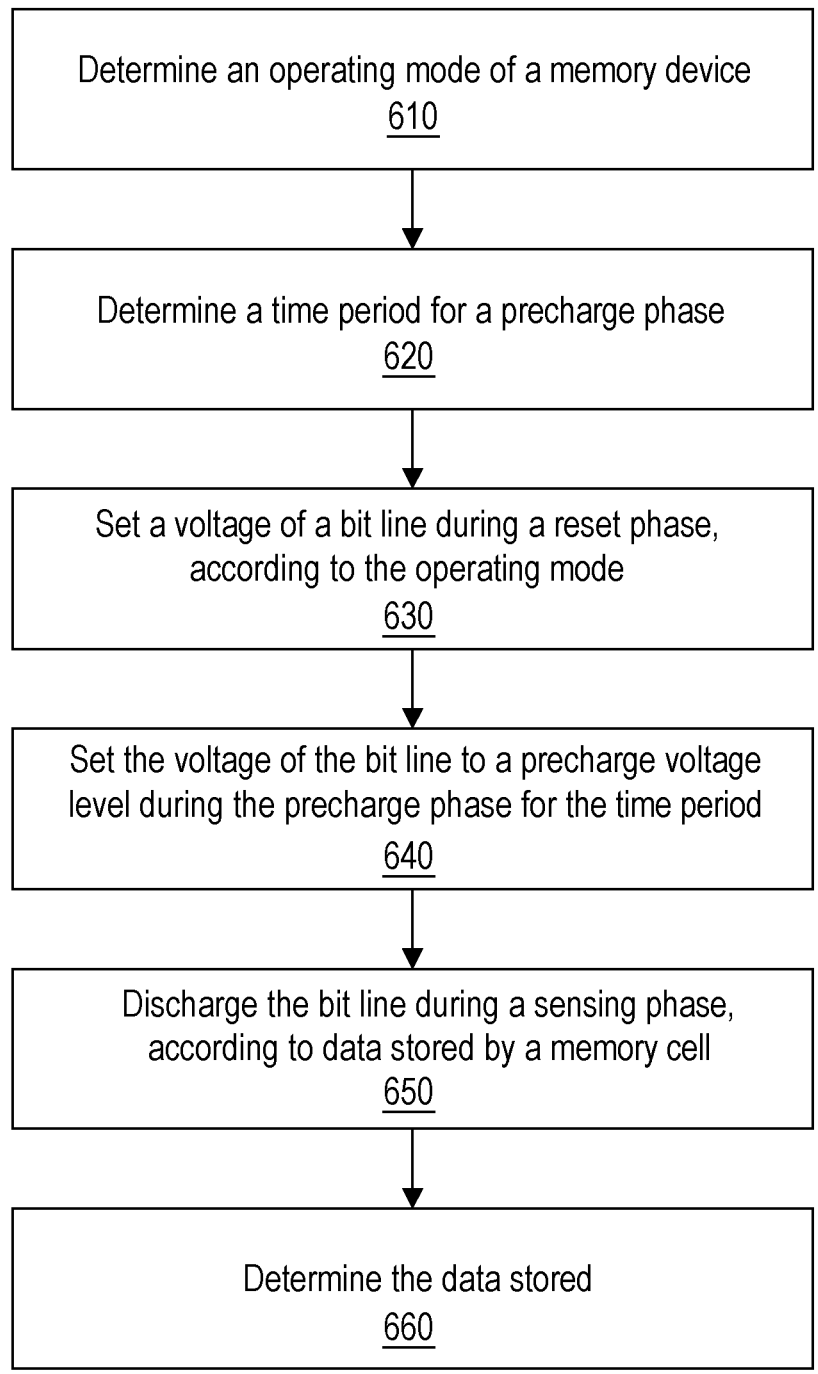
FIG. 6 is a flowchart showing a method of operating a memory device, according to an operating mode of the memory device, in accordance with some embodiments.

FIG. 6 is a flowchart showing a method 600 of operating a memory device (e.g., memory device 100), according to an operating mode of the memory device, in accordance with some embodiments. In some embodiments, the method 600 is performed by a controller (e.g., memory controller 105 or bit line controller 112). In some embodiments, the method 600 is performed by other entities. In some embodiments, the method 600 includes more, fewer, or different steps than shown in FIG. 6.

In one approach, the controller determines 610 an operating mode of a memory device (e.g., memory device 100). Examples of the operating mode include a first operating mode (e.g., a normal operating mode) and a second operating mode (e.g., a turbo operating mode). In one aspect, the memory device operating in the first operating mode (or the normal operating mode) may consume less power or have less leakage current than in the second operating mode (or the turbo operating mode). In one aspect, the memory device operating in the second operating mode (or the turbo operating mode) may operate faster than in the first operating mode (or the normal operating mode). The controller may obtain or receive a mode select signal (e.g., mode select signal 335) indicating an operating mode of the memory device, for example, from a processor or an external component coupled to the memory device. According to a voltage, current, or state of the mode select signal, the controller may determine the operating mode of the memory device.

In one approach, the controller determines 620 a time period (e.g., T1 or T2) for a precharge phase (e.g., P1). For example, the memory device operating in the first operating mode (e.g., normal operating mode) may have a larger time period (e.g., T1) for the precharge phase than the time period (e.g., T2) for precharge phase in the second operating mode (e.g., turbo operating mode). The controller may receive or obtain the mode select signal and determine the time period corresponding to the operating mode of the memory device as indicated by the mode select signal. For example, in response to the mode select signal 335 having a ground voltage level (e.g., GND or 0V) corresponding to the first operating mode, the controller may determine the time period for the precharge phase is T1. For example, in response to the mode select signal 335 having a supply voltage level (e.g., VDD or 1V) corresponding to the second operating mode, the controller may determine the time period for the precharge phase is T2 shorter than T1.

In one approach, the controller sets 630 a voltage of a bit line BL during a reset phase (e.g., P0), according to the operating mode of the memory device. For example, if the operating mode of the memory device indicated by the mode select signal is the first operating mode (e.g., normal operating mode), the controller may disable the reset voltage control circuit 230, such that the voltage of the bit line BL can be set to the ground voltage level (e.g., GND or 0V). For example, if the operating mode of the memory device indicated by the mode select signal is the second operating mode (e.g., turbo operating mode), the controller may enable the reset voltage control circuit 230, such that the voltage of the bit line BL can be set to the reset voltage level (e.g., VDD-Vth of a diode or a transistor).

In one approach, the controller sets 640 the voltage of the bit line BL to a supply voltage level (e.g., VDD or 1V) during a precharge phase (e.g., P1) for the determined time period. For example, the controller may enable the precharge circuit 220 during the precharge phase, such that the voltage of the bit line BL can be set to the supply voltage level (e.g., VDD or 1V).

In one approach, the controller discharges 650 the bit line BL during a sensing phase (e.g., P2), according to data stored by a memory cell (e.g., memory cell 125). For example, the controller may disable the precharge circuit 220 and the reset voltage control circuit 230 during the sensing phase. Meanwhile, the controller may provide the word line control signal 325 or cause the word line controller 114 to generate the word line control signal 325 to couple the memory cell 125 to the bit line BL during the sensing phase. By i) disabling the precharge circuit 220 and the reset voltage control circuit 230 and ii) coupling the memory cell 125 to the bit line BL during the sensing phase, the bit line BL may be discharged according to the data stored by the memory cell. For example, the voltage of the bit line BL may decrease, according to the data stored by the memory cell.

In one approach, the controller determines 660 the data stored by the memory cell 125, according to the voltage of the bit line BL discharged during the sensing phase. For example, if the sensed voltage of the bit line BL is lower than a reference voltage or a voltage of the bit line BLB, then the sense amplifier 240 may generate an output voltage corresponding to a logic state '0'. For example, if the sensed voltage of the bit line BL is higher than the reference voltage or a voltage of the bit line BLB, then the sense amplifier 240 may generate an output voltage corresponding to a logic state '1'. After the sensing phase, the controller may proceed to the step 610 or the step 630 and operate in a subsequent reset phase.

Advantageously, the memory device can operate faster by setting the voltage of the bit line to the second voltage level (e.g., VDD-Vth (threshold voltage) of the transistor). For example, the memory device 100 operating in the second operating mode (e.g., turbo operating mode) may have a shorter time period T2 for the discharge phase P1, than a time period T1 for the discharge phase P1 in the first operating mode (e.g., normal operating mode). In one aspect, charging the bit lines BL, BLB or setting the voltages of the bit lines BL, BLB to the supply voltage level (e.g., VDD or 1V) from the reset voltage level in the second operating mode (e.g., turbo operating mode) can be performed faster than charging the bit lines BL, BLB or setting the voltages of the bit lines BL, BLB from the ground voltage level (e.g., GND or 0V) to the supply voltage level (e.g., VDD or 1V) in the first operating mode (e.g., normal operating mode). Accordingly, the memory device 100 operating in the second operating mode (e.g., turbo operating mode) may have a shorter time period T2 for the discharge phase P1 than the time period T1 for the discharge phase P1 in the first operating mode (e.g. normal operating mode). By reducing the time period T2 for the discharge phase P1, the memory device can operate faster in the second operating mode (e.g., turbo operating mode).

In one aspect, the memory device can be adaptively configured or operated in a selected mode by enabling or disabling the reset voltage control circuit. For example, in a first operating mode (or a normal operating mode), the reset voltage control circuit can be disabled during the reset phase, such that the voltage of the bit line can be discharged to the ground voltage level. By setting the voltage of the bit line to the ground voltage level during the reset phase, leakage current during the reset phase can be reduced in the first operating mode (or a normal operating mode). For example, in a second operating mode (or a turbo operating mode), the reset voltage control circuit can be enabled during the reset phase, such that the voltage of the bit line can be set to the second voltage level (e.g., VDD-Vth (threshold voltage) of the transistor). By setting the voltage of the bit line to the second voltage level (e.g., VDD-Vth) during the reset phase, the memory device in the second operating mode can perform, for example, a read operation faster than in the first operating mode.

Figure 7:
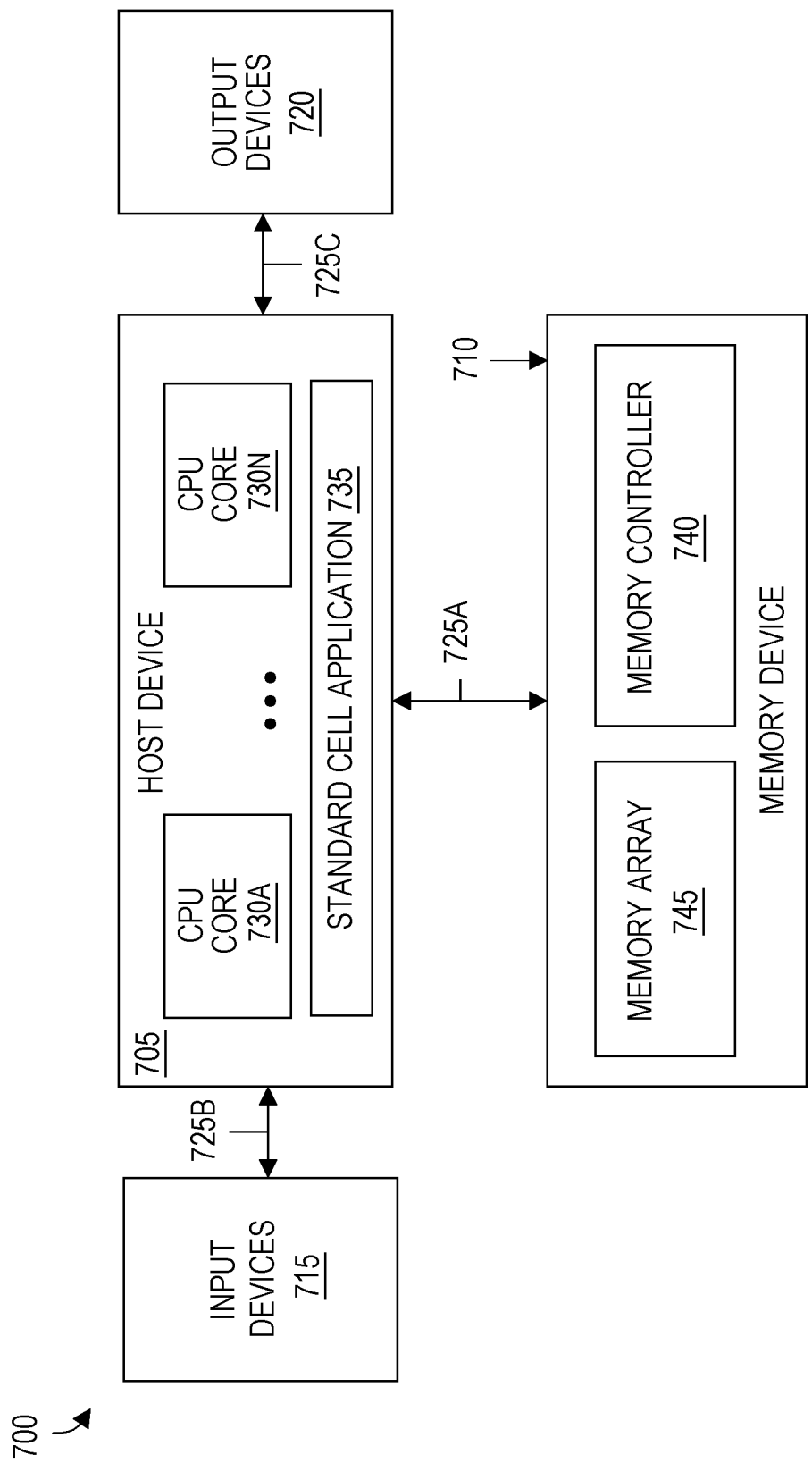
FIG. 7 is an example block diagram of a computing system, in accordance with some embodiments.

Referring now to FIG. 7, an example block diagram of a computing system 700 is shown, in accordance with some embodiments of the disclosure. The computing system 700 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 700 includes a host device 705 associated with a memory device 710. The host device 705 may be configured to receive input from one or more input devices 715 and provide output to one or more output devices 720. The host device 705 may be configured to communicate with the memory device 710, the input devices 715, and the output devices 720 via appropriate interfaces 725A, 725B, and 725C, respectively. The computing system 700 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 705.

The input devices 715 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 705 and that allows an external source, such as a user (e.g., a circuit or layout designer), to enter information (e.g., data) into the host device and send instructions to the host device. Similarly, the output devices 720 may include a variety of output technologies such as external memories, printers, speakers, displays, microphones, light emitting diodes, headphones, video devices, and any other output peripherals that are configured to receive information (e.g., data) from the host device 705. The "data" that is either input into the host device 705 and/or output from the host device may include any of a variety of textual data, circuit data, signal data, semiconductor device data, graphical data, combinations thereof, or other types of analog and/or digital data that is suitable for processing using the computing system 700.

The host device 705 includes or is associated with one or more processing units/processors, such as Central Processing Unit ("CPU") cores 730A . . . 730N. The CPU cores 730A . . . 730N may be implemented as an Application Specific Integrated Circuit ("ASIC"), Field Programmable Gate Array ("FPGA"), or any other type of processing unit. Each of the CPU cores 730A . . . 730N may be configured to execute instructions for running one or more applications of the host device 705. In some embodiments, the instructions and data to run the one or more applications may be stored within the memory device 710. The host device 705 may also be configured to store the results of running the one or more applications within the memory device 710. Thus, the host device 705 may be configured to request the memory device 710 to perform a variety of operations. For example, the host device 705 may request the memory device 710 to read data, write data, update or delete data, and/or perform management or other operations. One such application that the host device 705 may be configured to run may be a standard cell application 735. The standard cell application 735 may be part of a computer aided design or electronic design automation software suite that may be used by a user of the host device 705 to use, create, or modify a standard cell of a circuit. In some embodiments, the instructions to execute or run the standard cell application 735 may be stored within the memory device 710. The standard cell application 735 may be executed by one or more of the CPU cores 730A . . . 730N using the instructions associated with the standard cell application from the memory device 710. In one example, the standard cell application 735 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 7, the memory device 710 includes a memory controller 740 that is configured to read data from or write data to a memory array 745. The memory array 745 may include a variety of volatile and/or non-volatile memories. For example, in some embodiments, the memory array 745 may include NAND flash memory cores. In other embodiments, the memory array 745 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 745 may be individually and independently controlled by the memory controller 740. In other words, the memory controller 740 may be configured to communicate with each memory within the memory array 745 individually and independently. By communicating with the memory array 745, the memory controller 740 may be configured to read data from or write data to the memory array in response to instructions received from the host device 705. Although shown as being part of the memory device 710, in some embodiments, the memory controller 740 may be part of the host device 705 or part of another component of the computing system 700 and associated with the memory device 710. The memory controller 740 may be implemented as a logic circuit in either software, hardware, firmware, or combination thereof to perform the functions described herein. For example, in some embodiments, the memory controller 740 may be configured to retrieve the instructions associated with the standard cell application 735 stored in the memory array 745 of the memory device 710 upon receiving a request from the host device 705.

It is to be understood that only some components of the computing system 700 are shown and described in FIG. 7. However, the computing system 700 may include other components such as various batteries and power sources, networking interfaces, routers, switches, external memory systems, controllers, etc. Generally speaking, the computing system 700 may include any of a variety of hardware, software, and/or firmware components that are needed or considered desirable in performing the functions described herein. Similarly, the host device 705, the input devices 715, the output devices 720, and the memory device 710 including the memory controller 740 and the memory array 745 may include other hardware, software, and/or firmware components that are considered necessary or desirable in performing the functions described herein.

In one aspect of the present disclosure, a memory device is disclosed. In some embodiments, the memory device includes a memory cell, a precharge circuit, a reset voltage control circuit, and a logic control circuit. In some embodiments, the precharge circuit is coupled to the memory cell through a bit line. In some embodiments, the precharge circuit is configured to set a voltage of the bit line to a first voltage level. In some embodiments, the reset voltage control circuit includes a transistor coupled to the bit line to set the voltage of the bit line to a second voltage level. The transistor can be arranged or operate as a diode. In some embodiments, the logic control circuit is coupled to the precharge circuit and the reset voltage control circuit. In some embodiments, the logic control circuit to: cause the reset voltage control circuit to set the voltage of the bit line to the second voltage level during a reset phase, and cause the precharge circuit to set the voltage of the bit line to the first voltage level during a precharge phase after the reset phase.

In another aspect of the present disclosure, a memory device is disclosed. In some embodiments, the memory device includes a memory cell, a bit line coupled to the memory cell, and a controller. In some embodiments, the controller is configured to set a voltage of the bit line to a first voltage level during a reset phase, if an operating mode of the memory device is a first mode. In some embodiments, the controller is configured to set the voltage of the bit line to a second voltage level during the reset phase, if the operating mode of the memory device is a second mode.

In yet another aspect of the present disclosure, a method of operating a memory device is disclosed. In some embodiments, the method includes determining, by a controller, an operating mode of a memory device including a memory cell coupled to a bit line. In some embodiments, the method includes determining, by the controller, a time period for a precharge phase, according to the operating mode of the memory device. In some embodiments, the method includes setting, by the controller, a voltage of the bit line to a first voltage level during the precharge phase for the time period. In some embodiments, the method includes discharging, by the controller, the bit line during a sensing phase after the precharge phase, according to data stored by the memory cell. In some embodiments, the method includes determining, by the controller, the data stored by the memory cell during the sensing phase, according to the voltage of the bit line discharged during the sensing phase.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device including:
   a memory cell;
   a precharge circuit coupled to the memory cell through a bit line, the precharge circuit to set a voltage of the bit line to a first voltage level;
   a reset voltage control circuit including a transistor coupled to the bit line to set the voltage of the bit line to a second voltage level, the transistor operating as a diode; and
   a logic control circuit coupled to the precharge circuit and the reset voltage control circuit, the logic control circuit to:
      cause the reset voltage control circuit to set the voltage of the bit line to the second voltage level during a reset phase,
      cause the precharge circuit to set the voltage of the bit line to the first voltage level during a precharge phase after the reset phase, and
      determine that data stored by the memory cell is a first state, in response to the voltage of the bit line during a sensing phase having a third voltage level, wherein the second voltage level is between the first voltage level and the third voltage level.

2. The memory device of claim 1, wherein to determine that the data is the first state, the logic control circuit is to:
   cause the bit line to be discharged during the sensing phase after the precharge phase, according to the data stored by the memory cell, and
   determine the data stored by the memory cell during the sensing phase, according to the voltage of the bit line discharged during the sensing phase.

3. The memory device of claim 2, wherein the logic control circuit is to cause the reset voltage control circuit to set the voltage of the bit line to the second voltage level during a subsequent reset phase after the sensing phase.

4. The memory device of claim 1, wherein the logic control circuit is to:
   disable the reset voltage control circuit to bypass setting the voltage of the bit line to the second voltage level during the reset phase, if an operating mode of the memory device is a first mode, and
   enable the reset voltage control circuit to set the voltage of the bit line to the second voltage level during the reset phase, if the operating mode of the memory device is a second mode.

5. The memory device of claim 4, wherein the logic control circuit is to:
   cause, if the operating mode of the memory device is the first mode, the precharge circuit to set the voltage of the bit line to the first voltage level during the precharge phase after the reset phase for a first time period, and
   cause, if the operating mode of the memory device is the second mode, the precharge circuit to set the voltage of the bit line to the first voltage level during the precharge phase for a second time period, the second time period shorter than the first time period.

6. The memory device of claim 1, wherein the precharge circuit includes another transistor of a first type, wherein the reset voltage control circuit includes the transistor of a second type.

7. The memory device of claim 6, wherein the another transistor is a P-type transistor, and the transistor is a N-type transistor, wherein the another transistor is coupled between the bit line and a first metal rail to receive a supply voltage, wherein the transistor is coupled between the bit line and a second metal rail to receive the supply voltage.

8. The memory device of claim 6, wherein the another transistor is a P-type transistor, and the transistor is a N-type transistor, wherein the another transistor is coupled between the bit line and a metal rail to receive a supply voltage, wherein the transistor is coupled between the bit line and the metal rail to receive the supply voltage.

9. The memory device of claim 6, wherein the another transistor of the first type is a P-type transistor, wherein the transistor of the second type is a N-type.

10. A memory device including:
a memory cell;
a bit line coupled to the memory cell; and
a controller to:
set a voltage of the bit line to a first voltage level during a reset phase, if an operating mode of the memory device is a first mode,
set the voltage of the bit line to a second voltage level during the reset phase, if the operating mode of the memory device is a second mode, and
set the voltage of the bit line to a third voltage level during a precharge phase after the reset phase, wherein the third voltage level is higher than the first voltage level and the second voltage level.

11. The memory device of claim 10, wherein the first voltage level is lower than the second voltage level.

12. The memory device of claim 10, wherein the controller is to:
discharge the bit line during a sensing phase after the precharge phase, according to data stored by the memory cell, and
determine the data stored by the memory cell during the sensing phase, according to the voltage of the bit line discharged during the sensing phase.

13. The memory device of claim 10, wherein the controller is to:
set the voltage of the bit line to the third voltage level during the precharge phase after the reset phase for a first time period, if the operating mode of the memory device is the first mode, and
set the voltage of the bit line to the third voltage level during the precharge phase for a second time period, if the operating mode of the memory device is the second mode.

14. The memory device of claim 13, wherein the second time period of the second mode is shorter than the first time period of the first mode.

15. The memory device of claim 10, wherein to set the voltage of the bit line, the controller to cause a reset voltage control circuit to set the voltage of the bit line to the first voltage level during the reset phase and set the voltage of the bit line to the second voltage level during the reset phase.

16. A method comprising:
determining, by a controller, an operating mode of a memory device, the memory device including a memory cell coupled to a bit line;
determining, by the controller, a time period for a precharge phase, according to the operating mode of the memory device;
setting, by the controller, a voltage of the bit line to a first voltage level during the precharge phase for the time period;
discharging, by the controller, the bit line during a sensing phase after the precharge phase, according to data stored by the memory cell;
determining, by the controller, the data stored by the memory cell during the sensing phase, according to the voltage of the bit line discharged during the sensing phase;
setting, by the controller, the voltage of the bit line to a second voltage level during a reset phase before the precharge phase, if the operating mode of the memory device is a first mode; and
setting, by the controller, the voltage of the bit line to a third voltage level during the reset phase, if the operating mode of the memory device is a second mode, wherein the third voltage level is between the first voltage level and the second voltage level.

17. The method of claim 16, wherein the time period for the second mode is shorter than the time period for the first mode.

18. The method of claim 16, further comprising:
setting, by the controller, the voltage of the bit line to the second voltage level during a subsequent reset phase after the sensing phase, if the operating mode of the memory device is the first mode; and
setting, by the controller, the voltage of the bit line to the third voltage level during the subsequent reset phase, if the operating mode of the memory device is the second mode.

19. The method of claim 16, further comprising:
setting the voltage of the bit line to the first voltage level during the precharge phase after the reset phase for the time period, if the operating mode of the memory device is the first mode;
setting the voltage of the bit line to the first voltage level during the precharge phase for another time period, if the operating mode of the memory device is the second mode.

20. The method of claim 16, further comprising:
determining, by the controller, that the data stored by the memory cell is a first state, in response to the voltage of the bit line having the third voltage level.

* * * * *